United States Patent [19]

Oddi

[11] 4,148,654

[45] Apr. 10, 1979

[54] POSITIVE ACTING PHOTORESIST COMPRISING DIAZIDE ESTER, NOVOLAK RESIN AND ROSIN

[76] Inventor: Michael J. Oddi, 135 Fenno St., Revere, Mass. 02151

[21] Appl. No.: 707,672

[22] Filed: Jul. 22, 1976

[51] Int. Cl.$^2$ .............................................. G03C 1/54
[52] U.S. Cl. .................. 96/91 D; 96/115 R; 96/35.1; 260/25
[58] Field of Search ............... 96/35.1, 115 R, 115 P, 96/86 P, 33, 91 D; 260/2 S

[56] References Cited

U.S. PATENT DOCUMENTS

| | | | |
|---|---|---|---|
| 2,760,863 | 8/1956 | Plambeck, Jr. | 96/115 R |
| 3,025,162 | 3/1962 | Gilbert | 96/114 |
| 3,402,044 | 9/1968 | Steinhoff | 96/33 |
| 3,634,082 | 1/1972 | Christensen | 96/33 |
| 3,650,754 | 3/1972 | Jones | 96/88 |
| 3,713,831 | 1/1973 | Hayes et al. | 96/115 R |

OTHER PUBLICATIONS

Chemical Abstracts, vol. 61, col. 5130b (1964).
Encyclopedia of Polymer Science and Technology, vol. 12, pp. 146, 147, 152, 153, 154.

*Primary Examiner*—John D. Welsh

[57] ABSTRACT

Rosinous material is added to photoresist compositions to improve flexiblity, rheology and other physical properties. The rosinous material may be a rosin or a hydrogenated, esterified or neutralized derivative of a rosin. Particular advantages are achieved when the photoresists also contain a polyvinyl alkyl ether.

24 Claims, No Drawings

POSITIVE ACTING PHOTORESIST COMPRISING DIAZIDE ESTER, NOVOLAK RESIN AND ROSIN

BACKGROUND OF THE INVENTION

This invention relates to photoresists and, more particularly, to photosensitive compositions, as well as other compositions useful in conjunction with photosensitive compositions, which provide flexible photoresist coatings for use in processes employing photoresists, e.g. the production of printing plates, metal plating, etching of metals or ceramics, as in the production of circuit boards or other electrical components, and other standard uses of photoresists.

Photoresists are generally photosensitive or lightsensitive materials which, when exposed to light of the proper wave length, are chemically changed in their solubility or removability characteristics in certain solvents or developers. To develop a photoresist generally means to remove, by whatever means, those areas of the photoresist which become more easily removable during the selective exposure through the mask. A common and convenient means of development is through solvents which dissolve the more easily removed portion of the selectively exposed photoresist layer, but leave the remaining portions substantially intact. A material is "developable" as used in this application, if it is removable by any of the standard methods of development.

Two types of photoresists are available, negativeacting and positive-acting resists. Prior to exposure, negative-acting resists are soluble in developer, but with light exposure they undergo chemical change and become insoluble in such developers. After selective exposure through a film pattern, the unexposed photoresist is selectively dissolved, softened, or washed away, leaving the desired resist pattern on a substrate. The remaining resist pattern is used to protect the substrate, e.g. in etching processes, where surface etching of the substrate is desired only in the areas which underlie the unexposed resist.

Positive-acting resists work in the opposite manner, with light exposure making the resists soluble in the developer. In either case, the resist pattern that remains after development (and post baking in some cases) is insoluble and chemically resistant to the cleaning, plating, etching or other solutions used in the process of treating the substrate.

Processes involving the utilization of photoresist coatings, such as in the formation of printed circuit boards, photolithographs, name plates and the like, are well known in the art. These materials are particularly useful in the formation of printed circuit boards, where a typical operation might be the coating of a metal clad plastic base sheet with a photoresist composition in a thin film, which is thereafter exposed through either a positive or negative of the desired image. If the photoresist used is a positive-acting material, the lightexposed areas of the resist layer are rendered soluble by the exposure, and are removed by washing with a developer to leave the underlying metal layer exposed. The area surrounding the exposed metal, which were not reached by light in the selective exposure, remain and protect the portions of the metal layer which they overlie. An etchant to which the resist is impervious may then be used to etch away the exposed metal areas, or selective plating or other processes may be accomplished, and there remains a layer of resist in the desired image pattern. Later on in the manufacturing process, the remaining resist pattern may or may not be removed, as desired.

Previous resist compositions, particularly the positive-acting diazo-type resists, have been difficult to work with in order to obtain a quality product. Such diazo materials, which are normally incorporated in an alkali soluble resin such as phenol or cresol-formaldehyde novolak resins, are disclosed, for example, in U.S. Pat. No. 3,046,118, incorporated herein by reference, as well as in other patents, including U.S. Pat. Nos. 3,102,809; 3,106,465; 3,130,047; 3,130,048; 3,148,983, 3,061,430; 3,184,310; 3,188,210; 3,201,239; and 3,288,608. Such materials are typically highly brittle, and while in the liquid state have poor rheology or flow characteristics, do not wet the surface well, and exhibit poor drying characteristics. The poor rheology or inability to flow properly leads to "pinhole" defects, which are simply small points on the surface of the substrate which the photoresist has failed to completely flow over and wet. The brittleness leads to difficulties since whenever there is any undercutting, i.e. removal of the part of the resist layer close to the substrate by the etchant or other material being used on the substrate, or by the developer for the developable resist material, there remains a thin, brittle, unsupported layer of the resist, which may break off when the substrate is exposed to washing or rinsing operations. As a result, significant portions of the substrate surface become unprotected, and future operations such as etching, metal deposition, etc., take place on unwanted areas of the substrate.

Photoresist materials have previously been applied in a number of ways, either as a liquid or as a dry film. Liquids are typically applied by using rollers, wicks or squeegees, by dipping, by spraying or wiping, etc., the liquid photoresist material across the surface of the substrate to form a layer of liquid resist on the base material, followed by solidification of the resist.

Particular problems arise in connection with the photoresist production of printed circuit boards, because of the necessity of providing through-holes in the substrate, in order to obtain conductivity between the top of the substrate and the other side of the substrate. These through-holes are simply holes through the substrate and any metal cladding thereon, which are typically catalyzed and plated with electroless plating solution in order to form an electrical connection between the surfaces of the substrate.

When liquid materials are used in connection with the preparation of printed circuit boards having through-holes, the resist in the liquid form is frequently forced into the through-holes, where it (a) may not become sufficiently exposed to the activating radiation to become soluble, or (b) may be protected from the developer whereby it is not dissolved or removed in a reasonable time from the board. Should either of these occur, the presence of a residuum or resist in the through-holes prevents proper copper plating therein, and often results in defective printed circuits.

The difficulties of liquid resists in plugging through-holes gave impetus to the development of dry film methods of application of photoresist materials. See, e.g., U.S. Pat. Nos. 3,526,504 and 3,629,036, both of which are incorporated herein by reference. Dry film photoresists are made by forming a coating of photosensitive resist material on a base sheet, e.g. plastic such as polyethylene, polypropylene or polyesters, e.g. duPont Mylar, and the other side of the photosensitive resist material is usually also covered with a protective sheet, particularly if the photosensitive material is adversely affected by air, as are most negative-acting materials. Dry film resists may be supplied as sheets or rolls, and are typically applied to the substrate by removing the protective or backing layer, and adhering by heat and pressure the dry film layer of photoresist to the substrate.

Another significant development along this line is disclosed in copending U.S. patent application Ser. No. 655,082 filed Mar. 8, 1976, now abandoned, incorporated herein by reference, which discloses the use of a thin layer of photosensitive resist, preferably in the form of a dry film, overlaying a layer of nonphotosensitive, but developable resist. For example, such a dry film might comprise an upper layer of photoresist containing a diazo activator and an alkali soluble novolak resin, over a layer of non-photosensitive developable material, e.g. simply novolak resin without activator.

The development of dry film applied photoresists did much to eradicate the plugging of through-holes by the photoresist. However, many of the remaining problems were not solved. Since the dry film photoresist must be handled, even rolled, prior to application to the substrate, brittleness is even more of a problem, particularly with the diazo-type positive-acting photoresist mentioned above. Bending of sheets of very brittle materials causes cracking and flaking of the photoresist, which can result in inadequate coverage on the substrate. Also, pinholes and other defects caused by the photosensitive resist's inability to properly flow and coat the base sheet from which it is transferred to the substrate, can also transfer to the substrate, i.e., pinholes resulting when the liquid photoresist is formed into a layer on the plastic base sheet, can be transferred to the substrate when the photoresist is adhered to that substrate.

Attempts have been made to improve the characteristics of the photoresist materials by inclusion of film-forming materials to form thick coatings, e.g. in U.S. Pat. No. 3,402,044, incorporated herein by reference, and more recently by the incorporation of polyvinyl ethers into the photoresist material, U.S. Pat. No. 3,634,082, incorporated herein by reference. However, while some improvements were obtained, many of the previous problems remained unsolved.

It is accordingly an object of the present invention to provide a photoresist material which does not suffer from the characteristics of brittleness and poor rheology suffered by previous photoresist materials. It is a further object of the present invention to provide a photoresist material which is highly flexible and can be readily bent or worked with without cracking, flaking or peeling. It is a further object to provide flexible photoresist materials with improved flow characteristics. It is a further object to provide an additive for diazo-type photoresist compositions, which improves flexibility and flow properties, and decreases point defects and other imperfections.

SUMMARY OF THE INVENTION

It has now been found that the flexibility, rheology, wetting and other characteristics of photoresist materials, particularly those employing alkali-developable resins, are vastly improved if those materials include certain rosins and/or derivatives thereof. The rosinous components may be added over a wide range of concentrations, and may be used in combination with other additives.

Suitable rosinous materials include wood rosin, gum rosin, tall oil rosin, and their derivatives, including their hydrogenated, esterified and/or neutralized derivatives, as well as products extracted from rosin, e.g. resin acids and their derivatives. Such materials include alkyl and alkoxy esters of rosin, or of hydrogenated rosin, such as methyl, ethyl, propyl, glycerol, ethylene glycol, diethylene glycol, triethylene glycol, or pentaerythritol esters of rosin, or of hydrogenated rosin, abietic acid and its alkyl esters and derivatives such as methyl abietate, ethyl abietate, and methyl dihydroabietate, and dihydroabietyl alcohol (known generally as hydroabietyl alcohol) and its derivatives, such as the phthalate ester of dihydroabietyl alcohol. Further, these materials can be modified by linking to other monomers or polymers, resulting in what are commercially known, for example, as maleic-modified rosin esters or phenolic-modified rosin esters, such as phenolic-modified pentaerythritol ester of rosin (e.g. Pentalyn ®833, available from Hercules, Inc. of Wilmington, Delaware) and mixtures thereof. Presently preferred are what are described by the manufacturer and known in the trade as "rosin-derived elastomeric resins", sold under the trademark Neolyn ® by Hercules, Inc. (e.g., Neolyn ®20, Neolyn ®40), methyl ester of rosin (e.g. Abalyn ®, Hercules, Inc.), hydrogenated methyl ester of rosin (e.g. Hercolyn ®D, Hercules, Inc.), and triethylene glycol ester of hydrogenated rosin (e.g. Staybelite ®Ester 3, Hercules, Inc.) Other suitable rosinous compounds, salts, derivatives and polymers are described, for example, by Enos et al, "Rosin and Rosinous Derivatives", Kirk-Othmer *Encyclopedia of Chemical Technology*, Vol. 17, pp. 475 et seq., incorporated herein by reference. A number of synthetic or other substitutes for rosin or its derivatives have also been reported. See, e.g., Chem. Abstracts, 84:91881M (1976); Id 84:18311W (1976); Id 84:61633Q (1976); Id 82:60267V (1975); Id 80:134236S (1974); and Chakrabortty et al, "Synthetic Studies in Resin Acid Series: Part VII", Indian J. Chem. 12:948 (1974).

Preferably the rosinous material used has a low softening point, although materials having a softening point of up to about 170° C. (Hercules Drop Method) have been used. Preferably the softening point is below about 100° C., and most preferably the material is either liquid or balsamic in nature at 15°–40° C. The material should have an acid number of below about 300, preferably between about 0.3 and 200. Materials having low acid numbers of about 5 to 15 are most preferred.

The rosinous materials utilized in the present invention are preferably amorphous, non-interfering with the action of the sensitizer, e.g. the diazo light-sensitive material, and non-interfering with the developability of the photoresist system. In the preferred system, which involves positive-acting photosensitive resists utilizing alkali-soluble base resins, e.g. diazo-type resists in novolak-type resins, the rosinous material utilized in accordance with the present invention is preferably alkali soluble. However, this is not an absolute necessity, provided that the rosinous material does not interfere with the alkali solubility or developability of the entire system.

The present invention is quite useful in the system disclosed in copending U.S. application No. 665,082, referred to above, not only in the photosensitive resist layer, but also to improve the physical properties and quality of the non-photosensitive resist layer described in that patent. Thus replacement of part of the novolak resin in the non-photosensitive resist layer described in that patent will lead to a more highly flexible and higher quality composite film, which is easily manufactured, rolled for packing and transportation, and applied, without cracking, chipping or formation of other similar defects. Most preferably, both the non-photosensitive resist layer and the photosensitive resist layer incorporate rosinous materials in accordance with the present invention, which rosinous materials may be the same or may be different. As will be apparent to the skilled in the art, when the rosinous material is incorporated in the non-photosensitive resist layer, certain of the desirable characteristics of the rosinous material listed above will not be as important; for example, it is not as necessary that the rosinous material incorporated in the non-photosensitive resist layers be non-interfering with the action of the diazo light sensitizers, since there are no light sensitizers in such layers. However, it is still preferable that such rosinous materials be non-interfering, since that minimizes any adverse affect at the interface between the sensitizer-containing layer and the sensitizer-lacking layer. The rosinous materials of the present invention are also useful in other processes involving layers of materials which are not necessarily photosensitized, but which are developable in the standard developers, particularly in alkaline developers. See, e.g., the patent to Christensen et al, No. 3,649,283, issued Mar. 14, 1972.

The rosinous materials of the present invention may be incorprated into the photoresist compositions in a wide range of concentrations. Some effects are felt at low loading levels, and standard novolak systems can accommodate quite high loading levels without adversely affecting the developability of the photoresist layer. Generally, amounts of rosinous material between 1% by weight and 85% or higher by weight on a solids basis (i.e. excluding the solvent) are acceptable. The amount of rosinous material reduced to obtain maximum effect is higher when the rosinous material is the only additive to the novolak resin or the photosensitized novolak resin. Where the rosinous material is the only flexibility-improving additive contained in the photoresist, its preferred range of content is from about 55% to 80% by weight, solids basis. All weight percentages hereinafter are on a solids basis unless other wise stated.

Preferably the rosinous materials of the present invention are utilized in conjunction with certain polyvinyl ethers described in U.S. Pat. No. 3,634,082, incorporated herein by reference. Suitable polyvinyl ethers include those having repeating units that may be represented by the following structural formula:

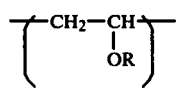

where R is a lower alkyl of from one to four carbon atoms. The polyvinyl ethers are available in forms varying from highly viscous liquids to tough rubbery materials dependent upon the linearity of the polymer chain and the average molecular weight of the polymer. Those polymers having a K value of at least 0.015 and preferably at least 0.040 are suitable. K value is obtainable from the relationship:

$$\text{Log } n_R/C = 75K^2/1 + 1.5KC + K$$

where $n_R$ is the relative viscosity of polymer solution, and C is the concentration of the polymer solution used to measure $n_R$ in grams per 100 ml. of solution. Small additions of the polyvinyl ether are beneficial and increasing amounts show increased improvement until insolubility in the coating composition is encountered or development is inhibited. The ratio of polyvinyl ether to the light-sensitive diazo compound may vary between about 0.5:1 to 6:1 and preferably between about 1:1 to 3:1, dependent upon the remaining constituents in the photosensitive composition. The polyvinyl ethers can be incorporated in amounts of from 0-70% by weight or higher, preferably from 25-40% by weight. At present, polyvinyl methyl ether is preferred, although a wide variety of polyvinyl ethers is disclosed in the aforesaid U.S. Pat. No. 3,634,082, the disclosure of which is herein incorporated by reference. This particular aspect of the present invention, the use of the rosinous materials in conjunction with the polyvinyl ethers appears to give quite synergistic and surprisingly improved results, and much lower levels of the rosinous material are required to get similar results. The preferred range of rosinous material used in conjunction with the polyvinyl ethers are from about 10-45% by weight, preferably from about 20-35% by weight.

Those resist materials made in accordance with the present invention which are intended to be photosensitive, should include sufficient photosensitive material, e.g. diazo-type photosensitive material, to render the light-exposed sections of such materials removable by the developing process, e.g. soluble in alkaline developers therefor. On the other hand, it should not contain such large amounts of photosensitive material as to adversely affect the resist properties of the unexposed portions of the resist layer, i.e., the ability to resist removal by the developer for the exposed portions or by the etchants or other chemicals used to treat the substrate in the process employing the photoresist. High amounts of photosensitizer also tend to increase the brittleness of the photoresist. Generally, photosensitive materials will be incorporated in an amount from about 1-20% by weight, preferably from about 5-15% by weight and most preferably between about 8-12% by weight.

Additional additives to the light-sensitive compositions may include small quantities of additional resins, plasticizers such as dioctyl phthlate, dibutyl phthlate, or mineral oil, and dyes to make the coating and the developed image more visible. These various ingredients may generally be incorporated in an amount of from 0-6% by weight provided that they do not interfere with the photosensitivity or the resist properties of the material. Any dyes added are preferably included only to the extent of about 0.01-1.5%, preferably 0.2-0.6%, so as to provide sufficient color without masking out and screening the light rays from parts of the photosensitive materials. Higher amounts of dyes can be utilized where the rosinous material of the present invention is incorporated into non-photosensitive resist layers.

The preferred diazo-type photoresists embodying the present invention contain from about 10% to 90% by weight alkali-soluble novolak resin, e.g. phenol-formaldehyde novolak resin or cresol-formaldehyde novolak resin. Preferably the composition contains from about 15% to 45% by weight of the novolak.

The above percentages are given on a weight percentage of the final photoresist film, whether the photoresist is applied as a liquid and thereafter dried, or whether it is applied in the form of a dry film. In order to produce a liquid photoresist composition to be applied to a substrate, the ingredients as specified above are preferably mixed in an organic solvent in which the light-sensitive diazo compounds are soluble at room temperature. However, the light-sensitive compounds, and the other ingredients may be incorporated into the solvent at higher temperatures, although partial decomposition of the photosensitive material present, if any, is likely to occur. Exemplary of suitable solvents are ethylene glycol monomethyl ether, ethylene glycol monoethyl ether, aliphatic esters, such as butyl acetate, aliphatic ketones, such as methyl isobutyl ketone and acetone, cyclohexanol, toluene, dioxane, xylene, commercial solvents Cellosolve (Union Carbide), halogenated aromatics such as chlorinated xylene, benzene and toluene, and mixtures thereof. The photoresist materials of the present invention in liquid form will generally contain from about 30-99% solvent by weight of the total material, depending upon the viscosity desired and the end use intended for the material. Preferably the solvent is between about 60-90% by weight of the total.

The liquid resist made in accordance with the present invention may be applied to the substrate by standard methods, including spin coating, roll coating or dipping. The preparation of the present resist materials in dry film form may involve the similar application of a liquid containing the above ingredients in a solvent by such methods as spin coating, roll coating or dip coating, to a suitable support sheet such as a polyester (e.g. Mylar) or treated or untreated paper carrier. In either case, the solvent is generally removed by drying at a temperature below the decomposition temperature of the diazo, which is generally below 110° C., and more preferably below 100° C. The drying takes place at a time which depends on the nature of the solvent used, but generally ranges from 1-30 minutes with convenience of shorter times between balanced against the adverse effect of increased decomposition of any photosensitive component at the increased temperatures used to obtain shorter drying times.

It is quite surprising that the rosinous materials of the present invention result in dramatic increases in flexibility and improvements in other properties. Attempts at obtaining similar increases in flexibility and improvements in other properties using standard plasticizers, such as dibutyl phthalate, not only failed to achieve the increase in flexibility, but also created other problems. Thus incorporation of dibutyl phthalate is substantial amounts not only results in resist films which do not exhibit substantial flexibility, i.e. they do not exhibit elongation on pulling by hand, and suffer flaking and cracking on bending 145 degrees or even 90 degrees when supported by copper foil, it also results in problems which prohibit their use in many instances. For example, phthalates and similar materials appear to form a film of lubricant between the photoresist layer and the backing layer when attempts are made to manufacture them in the form of dry film.

Attempts to solve rheology and coating problems such as pinhole defects, by including film formers such as styrene (e.g. U.S. Pat. No. 3,402,044, supra) simply did not solve the problem of lack of flexibility. Finally, while the use of polyvinyl ethers (U.S. Pat. No. 3,634,082) did obtain improvement in flexibility, the improvements in flexibility and other properties obtained through the use of the rosinous compounds or materials of the present invention far overshadow those previously obtained, especially when the rosinous materials are used in conjunction with the polyvinyl ethers.

Methods for using the photoresist material produced in accordance with the present invention are well known in the art. For example, a printing plate may be obtained photomechanically from the light-sensitive material, applied either as a liquid or as a dry film, in known manner, with the light-sensitive coating being exposed under a master to the action of light and the exposed coating then being developed with a dilute alkaline solution to produce an image. The developed coating may be rinsed with water, and, in the portions bared by the developer, the metal support can be made water-conductive with treatment of approximately 1% phosphoric solution, to which dextrine or gum arabic may be added. When the printing plate is inked with greasy ink, the ink will adhere to the remaining portions of the original light-sensitive coating and positive copies will be obtained from positive masters. Similarly, where the light-sensitive material is to be used as a photoresist, the metal support, in the portion bared by the developer, is treated with a suitable etching solution for a time sufficient to etch the metal base to the desired degree. After etching, the plate is rinsed and the remaining light-sensitive coating is removed, if desired, for example, by treatment with an organic solvent such as one of those described above as useful in the preparation of the light-sensitive coating.

The invention will be further illustrated by reference to the following examples.

EXAMPLE 1

The control solution is prepared having the following composition: 18.2 grams of an alkali-soluble phenol formaldehyde novolak resin (Alvinol 429K), 0.2 g of a dye, 6.2 grams of a photosensitizer having the following formula:

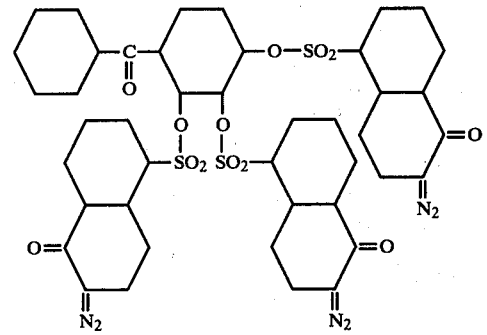

and sufficient solvent (mixture of 1 part n-butyl acetate, 1 part xylene, and 8 parts Cellosolve solvent by volume) to give 100 ml.

This solution is coated onto laminated base material, i.e. a phenolic laminate having a copper foil weighing 1 ounce per square foot laminated thereon, by spin coating at a speed of 78 rpm. The light-sensitive coating solution is fed into the finished foil at the center of rotation and the spinning is continued for a period of 5 minutes. The coating is dried as applied using a 250W infrared radiator mounted approximately 6 inches above the center of rotation. The coated support is then placed in a circulating air of a temperature of 150° F. for about 30 minutes, thoroughly drying the photoresist layer.

The coating so formed has a thickness of about 150 microns. It cracks and shales along its edge when cut with shears. Its flexibility is tested by removing a strip of the copper foil having the photosensitive coating from the phenolic substrate and folding the foil upon itself by about 90 degrees. A coating is considered flexible if it does not separate from the copper base or crack due to this treatment. The coating prepared using the foregoing procedure flaked into brittle fragments leaving a bare copper surface upon folding through 90 degrees.

EXAMPLES 2 THROUGH 10

The following Table illustrates photosensitive compositions including both rosinous material and a polyvinyl ether additive:

| EXAMPLES | 2 | 3 | 4 | 5 | 6 | 7 | 8 | 9 | 10 |
|---|---|---|---|---|---|---|---|---|---|
| Novolak[1], gm | 19.8 | 19.8 | 19.8 | 19.8 | 19.8 | 19.8 | 19.8 | 19.8 | 19.8 |
| Photosensitizer[2], gm | 6.3 | 6.3 | 6.3 | 6.3 | 6.3 | 6.3 | 6.3 | 6.3 | 6.3 |
| Dye[3], gm | 0.3 | 0.3 | 0.3 | 0.3 | 0.3 | 0.3 | 0.3 | 0.3 | 0.3 |
| Rosinous material, gm | | | | | | | | | |
| Neolyn ®40 | 15.0 | | | | 15.0 | 15.0 | 15.0 | 12.0 | 12.0 |
| Steybelite ®Ester[3] | | 15.0 | | | | | | | |
| Abalyn ® | | | 15.0 | | | | | | |
| Hercolyn ® | | | | 15.0 | | | | | |
| Neolyn ®20 | | | | | | | | 3.0 | |
| Pentalyn ®255[4] | | | | | | | | | 3.0 |
| Polyvinyl ethers | | | | | | | | | |
| Polyvinyl methyl ether | 18.6 | 18.6 | 18.6 | 18.6 | | | 15.0 | 18.6 | 18.6 |
| Polyvinyl ethyl ether | | | | | 18.6 | | | | |
| Polyvinyl isobutyl ether | | | | | | 18.6 | | | |
| Film forming additive | | | | | | | | | |
| Resimene 882[5] | 0.0 | | | | | | 3.6 | | |

[1] As in Example I
[2] p-diazo-2,5-dibutory-1-morpholino benzene boro fluoride
[3] Red dye by Clyoplate Corp.
[4] Hercules, Inc., described by manufacturer as "alcohol and alkali soluble resin"
[5] Monsanto Chemical Company, described as the reaction product of malamine, formaldehyde and butyl alcohol, according to Monsanto Product Information Bulletin No. 1094

EXAMPLE 11

37.5 grams of a 50% solution of Neolyn ® 40 in n-butyl acetate is combined with Photoresist AZ 1370 J, manufactured by Azoprate Corporation of Summit, N.J., which contains about 27% solids which comprise about 76.5% by weight of an alkali-soluble novolak resin and 23.5% by weight of a naphthoguinone diazo ester sensitizer agent. After spin coating on a copper substrate at 78 rpm for 5 minutes, the composition is baked at 90° C. for 20 minutes to obtain a photoresist layer having 1.43 g of sensitizer (5.75% by weight), 4.65 g novolak (18.75 by weight) and 18.75 g of novolak (75.5% by weight).

This photoresist composition is tested for flexibility, adheres to the copper and does not crack or flake when folded on itself at 90 degrees. Selected exposure to light followed by immersion in an alkaline developer results in a developed image having excellent resolution.

This example illustrates that photosensitive systems can take extremely high loading of the rosinous materials of the present invention, high enough to give very flexible photosensitive resist coatings, which are nevertheless developable in the normal manner.

The embodiments of the invention which have been described and illustrated are intended to be exemplary only, and many modifications will be apparent to those skilled in the art, all of which are considered and intended to be within the scope and the spirit of the appended claims.

I claim:

1. An alkali soluble, positive working photoresist composition comprising a naphthoquinone (1,2)-diazide sulfonic acid ester photosensitizer, a novolak resin in an amount of from 10 to 90% by weight, on a solids basis, of the photoresist composition, which novolak resin is rendered developable by the action of activating radiation on the photosensitizer, and a rosinous material in an amount of between about 1% and 85% by weight, on a solids basis, of the photosensitive resist composition, selected from the group of rosin, hydrogenated rosin, esterified rosin, neutralized rosin, esterified hydrogenated rosin, esterified neutralized rosin, and mixtures thereof.

2. The composition of claim 1, wherein the rosin is selected from the group of wood rosin, gum rosin and tall oil rosin.

3. The composition of claim 1, wherein the rosinous material is selected from the group of alkyl esters of rosin, alkoxy esters of rosin, and mixtures thereof.

4. The composition of claim 1, wherein the rosinous material is a balsamic rosinous material.

5. The composition of claim 1, wherein the rosinous material is selected from the group of rosin-derived elastomeric resin, methyl ester of rosin, hydrogenated methyl ester of rosin, triethylene glycol ester of rosin, and mixtures thereof.

6. The composition of claim 1, wherein the rosinous material is an ester of rosin selected from the group of methyl, ethyl, propyl, glyceryl, ethylene glycol, diethylene glycol, and triethylene glycol esters of rosin, and mixtures thereof.

7. The composition of claim 1, wherein the rosinous material is an ester of hydrogenated rosin, selected from the group of methyl, ethyl, propyl, glyceryl, ethylene glycol, diethylene glycol, and triethylene glycol esters of hydrogenated rosin, and mixtures thereof.

8. The composition of claim 1 further comprising a polyvinyl ether selected from the group of polyvinyl methyl ether and polyvinyl ethyl ether, said polyvinyl ether having a K value of at least 0.015.

9. The composition of claim 8, wherein the polyvinyl ether has a K value of at least 0.040.

10. The composition of claim 1, wherein the rosinous material comprises from about 10% to 40% by weight, on a solids basis, of the photoresist composition.

11. The composition of claim 10, wherein the rosinous material comprises from about 20% to 35% by weight, on a solids basis, of the photoresist composition.

12. The composition of claim 8, wherein the polyvinyl ether comprises from about 25% to 40% by weight, on a solids basis, of the photoresist composition.

13. The composition of claim 12, wherein the photosensitive material comprises from about 5% to 15% by weight, on a solids basis, of the photoresist composition.

14. The composition of claim 1, wherein the novolak resin comprises from about 15% to 45% by weight, on a solids basis, of the photoresist composition.

15. The composition of claim 1, further comprising a solvent which dissolves the photosensitizer, the polymeric material, and the rosinous material.

16. The composition of claim 15, wherein the solvent is selected from the group of glycol monoalkyl ether, an aliphatic ester, an aliphatic ketone, a halogenated monocyclic aromatic, and mixtures thereof.

17. The composition of claim 15, wherein the solvent comprises from about 50% to 99% by weight of the photoresist composition.

18. A dry film photoresist product comprising a dried layer of the photoresist composition of claim 1.

19. The dry film photoresist product of claim 1 over a flexible support adhered to said dried layer of the photoresist composition.

20. A dry film photoresist product comprising a dried layer of the photoresist composition of claim 1 over a layer of non-photosensitive resist material.

21. The product of claim 20, wherein the non-photosensitive resist layer comprises a resin which is developable by a developer for the photosensitive resist, and a rosinous material selected from the group of rosin, hydrogenated rosin, esterified rosin, neutralized rosin, esterified hydroginated rosin, esterified neutralized rosin, and mixtures thereof.

22. A photoresist product, comprising a layer of photosensitive resist material and a layer of non-photosensitive resist layer comprising a polymeric material which is developable by a developer for the photosensitive resist layer, and a rosinous material selected from the group of rosin, hydrogenated rosin, esterified rosin, neutralized rosin, esterified hydrogenated rosin, and mixtures thereof.

23. The product of claim 22, wherein the rosinous material is selected from the group of rosin-derived elastomeric resin, methyl ester of rosin, hydrogenated methyl ester of rosin, triethylene glycol ester of rosin, and mixtures thereof.

24. The dry film of claim 21 further including a flexible support, said dried layer of the photoresist composition being adhered to said flexible support.

* * * * *